United States Patent [19]

Torii et al.

[11] 4,382,839
[45] May 10, 1983

[54] PROCESS FOR PRODUCING FERRITE SINGLE CRYSTALS

[75] Inventors: Michihiro Torii, Hamamatsu; Utsuo Kihara, Kosai; Hirohito Goto, Gyoda; Isamu Sasaki, Kosai, all of Japan

[73] Assignee: Fuji Electrochemical Co., Ltd., Tokyo, Japan

[21] Appl. No.: 301,946

[22] Filed: Sep. 14, 1981

Related U.S. Application Data

[63] Continuation of Ser. No. 134,450, Mar. 27, 1980, abandoned.

[30] Foreign Application Priority Data

Mar. 28, 1979 [JP] Japan .................. 54-36710

[51] Int. Cl.³ ............................................. C30B 11/02
[52] U.S. Cl. ................................................ 156/616 R
[58] Field of Search ........... 156/620, 616 R, DIG. 63, 156/DIG. 74, DIG. 75, DIG. 77, DIG. 106; 422/247, 248, 253

[56] References Cited

U.S. PATENT DOCUMENTS

| | | | |
|---|---|---|---|
| 2,361,382 | 10/1944 | Camin | 156/616 R |
| 2,990,258 | 6/1961 | Augustine | 156/DIG. 74 |
| 3,265,469 | 8/1966 | Hall | 156/608 |
| 3,434,892 | 3/1969 | Heimke | 156/616 R |
| 3,536,121 | 10/1970 | Piearcey | 156/616 R |
| 3,846,322 | 11/1974 | Sugimoto et al. | 156/616 R |

OTHER PUBLICATIONS

Sugimoto, "Magnetic Crystals by Bridgman Technique", Jan. 1978, pp. 125-139, published in "Crystals" by Springer-Verlag Press, N.Y.

Primary Examiner—Hiram H. Bernstein
Attorney, Agent, or Firm—Fleit, Jacobson & Cohn

[57] ABSTRACT

A new method for preparation of Mn-Zn or Ni-Zn type ferrite single crystals. The ferrite materials are provided in a lower portion of a crucible and completely dissolved. The crucible is moved within a predetermined atmosphere of temperature gradient. A solid which is equilibrium in composition to the ferrite materials is supplied into the crucible while the dissolved ferrite materials are crystallizing from the lower extremity while a liquid-phase zone is maintained constant in depth. Ferrite single crystals of at least about 800 mm in length are grown which are homogeneous in composition throughout their length.

8 Claims, 4 Drawing Figures

4,382,839

PROCESS FOR PRODUCING FERRITE SINGLE CRYSTALS

This is a continuation of application Ser. No. 134,450 filed Mar. 27, 1980 now abandoned.

BACKGROUND OF THE INVENTION

The present invention relates generally to a process for preparing ferrite single crystals by improvement of the Bridgman method.

Single crystals of ferrite such as manganese-zinc ferrite are used in narrow track magnetic recording heads which facilitate high density data storage and autodiovisual, video and digital devices. These crystals are characterized by applicability over a wide frequency range, low rubbing noise and superior mechinability and bonding properties to glass.

Vavious attempts and techniques, such as the Bridgman method, the floating zone method, have been made and employed in preparing these ferrites. Of these techniques, the Bridgman method has been proved to be most successful for growing crystals for an industrial use.

Crystals grown by the conventional methods, however, have been limited to a nominal 150 mm length by the dimensions of the furnace employed and are inhomogeneous in composition and consequently in magnetic properties.

In the ordinary Bridgman method, all of the ferrite is brought into solution before crystallization occurs. Individual components such as MnO, ZnO and $Fe_2O_3$ might be induced to crystalize uniformly under proper temperature and atmosphere conditions. However, the ternary mixture, such as MnO, ZnO and $Fe_2O_3$, is less controllable. As illustrated in FIG. 1, which shows schematically the binary phase relations in such a system, the liquidus and solidus curves are spread apart with the result that a melt of composition X' will crystallize as a solid of composition X and the crystal progressively increases in Mn content. Moreover, the practical length of crystals grown by the ordinary Bridgman method is limited, at most, to 150 mm primarily by the temperature gradients in the furnace. Further, the thus produced crystals of 150 mm in length has a wide variety of compositional variation along the lengthwise direction thereof, as well illustrated in FIG. 4, with the result of unproductivity and consequently of expensiveness.

An attempt has been made to overcome such disadvantages as described above, by successively charging make-up materials continuously to the initial ferrite material to the extent necessary to resupply the ingredients of the composition which decrease as the single crystal grows. However, this attempt does not improve the above-described Bridgman method but still has similar disadvantages as those of the aforementioned method. Namely, the ingredients successively suppied are those which are limited to those materials which are consumed as the crystal grows which limits the size of the crystal to the amount of the ferrite materials initially supplied to a crucible plus about 10–15 percent in volume of the initially supplied ferrite. Therefore, as described before, the practical length of crystals grown by this attempt is limited at most to 150 mm. Additionally, it is quite difficult to control when, how and what amount of ingredients or components which has decreased in the composition should be additionally supplied. Such control should be carried out experimentarily.

SUMMARY OF THE INVENTION

It is a primary object of the present invention to provide an improved process for producing ferrite crystals without any of the disadvantages peculiar to the conventional methods.

Another object of the present invention is to provide an improved method as above which permits a production of large ferrite crystals of several tens of centimeters in length with a compositional homogeneity along the substantially total length thereof except for the extremities thereof.

Another object of the present invention is to provide an improved method as above which facilitates an easy control of compositional homogeniety.

Another object of the present invention is to provide a new process for producing large ferrite crystals of compositional homogeniety, which can be readily carried out without the involvement to substantial labour or difficulty.

Briefly, the present invention provides a process for producing ferrite single crystals comprising the steps of supplying ferrite materials at a lower portion of a crucible, subjecting the ferrite materials to be crystallized and simultaneously supplying a solid which has a composition equilibrium to a liquidus (liquid-phase) zone into a crucible to successively melt the supplied solid such that a depth of the liquidus zone maintains constant.

Other objects and features of the present invention will become apparent from the detailed description of the preferred embodiments thereof, which will be made with reference to the accompanying drawings.

DETAILED DESCRIPTION OF THE INVENTION

Figure 2:
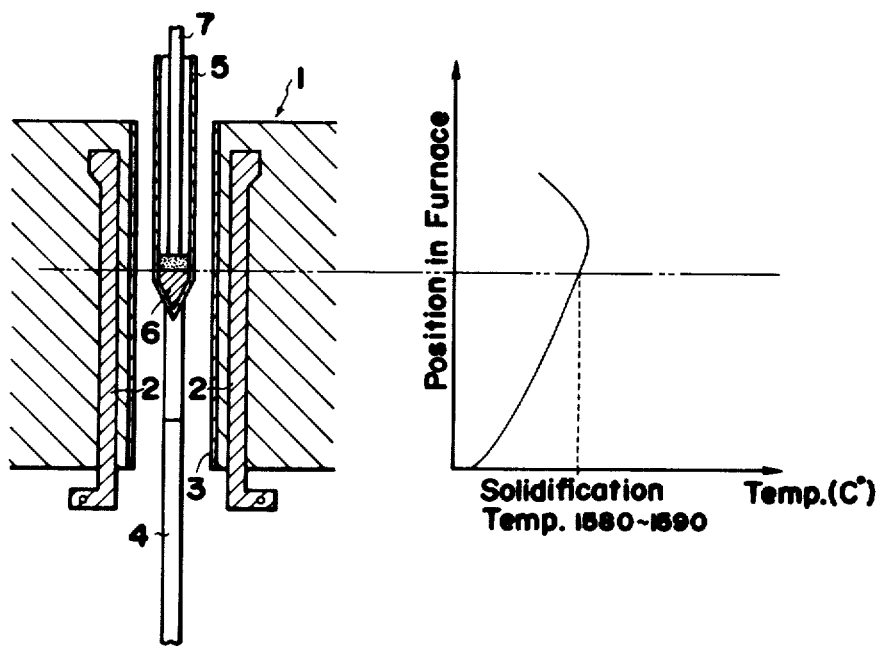
FIG. 2 is a sectioned view of a part of an electric furnace applied to the present invention, and a graph which shows a temperature gradient of an interior of the electric furnace.

Referring first to FIG. 2, an electric furnace 1 may be of the conventional type as used in the Bridgman method, but preferably has a temperature gradient more gentle than that of the furnace of the Bridgman method. The electric furnace 1 has a heater 2 which provides a desired temperature gradient along the lengthwise direction of the furnace 1. The temperature gradient is such that a temperature above a melting point of ferrite materials is maintained at the middle portion of the furnace and that the temperature goes down as it goes towards the bottom of the furnace. Temperature gradient of 5°–80° C./cm may be employed. At the center of the furnace is provided a alumina tube 3 on a cylindrical surface thereof. Within the alumina tube a crucible 5 is lowered by means of a lowering device which is generally shown by reference numeral 4.

The crucible 5 is tapered at the lower end and has a length of, for example 850 mm, which is much longer than that of the conventional type. The lower end portion of the crucible 5 is supplied with the ferrite materials 6 and then lowered by the lowering device 4 gradually. The lowering device may be of any type or construction if it can lower the crucible 5 gradually. When the crucible is lowered, the ferrite material is first melted completely and then a single crystal is grown up gradually from the lower extremity of the crucible 5. From the point that the liquidus depth reaches a suitable value, for example about 10 cm, a solid of composition equivalent to the liquidus is added, while the solidification is continued, into the crucible 5 so that the above described liquidus depth may be maintained and the added ferrite material is successively melted. Thus, a large single crystal is produced which is homogeneous along the substantially total length thereof.

In respect of terminology, the words "solid of composition equivalent to the liquidus" represents a solid which, when melted, will have the same composition as that of the liquidus zone.

The added ferrite material may be of any shape or state such as rod-shape, pellet or powder, but rod-shaped structure will be preferred for a continuous melting.

Figure 1:
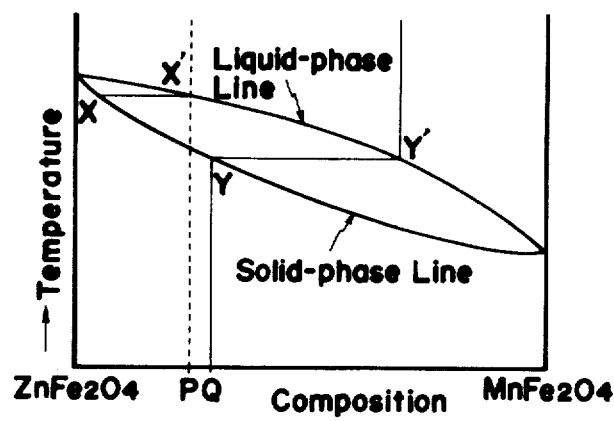
FIG. 1 is a schematic diagram showing phase relations between liquidus and solidus zones of Mn-Zn ferrites.
Figure 3:
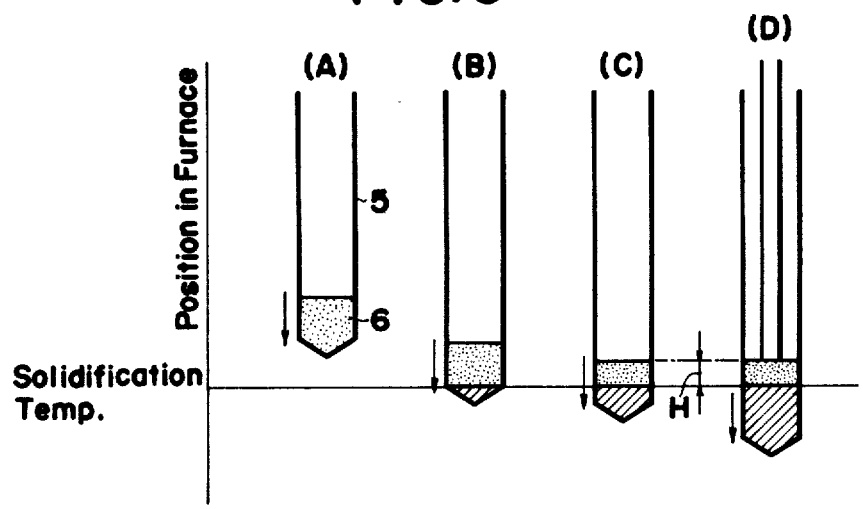
FIG. 3 is explanatory diagram which shows a time-variation of state within a crucible.

A priniciple of homogeneous single crystal production will be described with reference to FIGS. 1 and 3. The ferrite material 6 is initially supplied in the lower portion of the crucible 5 and then completely melted within the furnace as illustrated by (A) in FIG. 3. Assuming that composition of the initially supplied ferrite is illustrated as "P" (FIG. 1), all the initially supplied ferrite P is in a melted condition and therefore considered as a liquidus (liquid phase), and its composition X' is homogeneous to the composition of the ferrite P. When the crucible 5 is gradually lowered to, and then below, the solidification temperature as shown by (B) of FIG. 3, solidification will occur gradually from the bottom. Thus crystallization will be realized. If the crucible 5 is lowered further, the solidus and liquidus zones are changed in composition along a solid-phase line and a liquid-phase line, respectively, and the crystallization is continued. At the time when the solidus depth becomes a suitable value "H" (FIG. 3 (C)), assuming that the composition of upper extremity of the solidus and the composition of the liquidus are Y and Y', respectively, a previously composition-arranged rod-shaped ferrite material 7 is inserted into the crucible from top thereof to dip within the liquidus zone to be melted, and the liquidus depth is controlled so that the suitable value H, for example 10 cm, may be maintained. (FIG. 3 (D)). The supplied rod shaped ferrite material 7 is a solid (composition Y) of the composition equilibrium to the liquidus (composition Y'). A single crystal obtained under this condition has a composition Y. Namely, by maintaining the liquidus composition and depth constant, it becomes possible to grow a single crystal which has a homogeneous composition Y=Q, in which Q represents the composition of the grown single crystal.

Provided that the liquidus depth is not maintaining constant, a relation between crystallization and the additional supply will become ill-ballanced. For example, if a crystallizing amount is greater than a supplying amount, the liquidus depth becomes smaller and the liquidus composition state shifts from the required or predetermined state toward the side of $MnFe_2O_4$ along the liquidus line as shown in FIG. 1. On the other hand, in case that supplied ferrite material is larger in amount than the crystallization, the liquidus depth becomes greater and the liquidus composition shifts toward the side of $ZnFe_2O_4$. This means that the liquidus composition increases in either Mn or Zn content. Thus, variation or change in liquidus composition results in a variation of crystallized composition and consequently in inhomogeneous crystals.

In order to attempt the homogeniety, the alumina tube in the furnace should be completely sealed since a partial pressure of oxygen at a phase boundary between the liquidus and solidus zones should be maintained constant.

It is preferred that the liquidus depth is controlled as small as possible so that a metal ion density in the liquidus zone may be maintained constant. However, a care should be taken that an excessively thinned liquidus depth will sometimes cause a generation of cracks or any other defects. Therefore, it is necessary to determine carefully the liquidus depth in light of ferrite material composition, structure of the electric furnace, etc. The inventors have found that the liquidus depth in the range of 4 cm–15 cm, preferably 8 cm, is desirable, and that a liquidus depth smaller than this range causes degradation or inferior quality of grown crystal, and a liquidus depth greater than the range makes it difficult for the ferrite material to be melted.

Volume of the added ferrite material can be calucalated under the following formula:

$$V = \pi \cdot (D/2)^2 \cdot S_c$$

wherein:
V is a volume of added ferrite per unit time;
D is a diameter of the crucible; and
$S_c$ is a lowering speed of the crucible.

Thus, in case of a ferrite rod as the added ferrite material, lowering speed $S_r$ of the ferrite rod may be obtained as follows:

$$S_r = D^2/d^2 \cdot S_c$$

wherein d is a diameter of the ferrite rod.

EXAMPLE

An example of the process according to the present invention will be described.

A single crystal of Mn-Zn spinel type ferrites commonly used for a magnetic recording head core is now explained. In the first place, a ferrite material of 1.5 Kg. which consists of iron oxide ($Fe_2O_3$) of 52.0 mol percent, manganese oxide (MnO) of 29.0 mol percent and zinc oxide (ZnO) of 19.0 mol percent was prepared.

The thus prepared ferrite material was then supplied into a platinum crucible of 90 mm in outer diameter and 850 mm in length, and melted within an electric furnace. The furnace employed in doubly sealed unit with a graphite heating element that is protected from the oxygen atmosphere employed chamber (800 mm Hg) by a high purity alumina core tube 3. The length of the furnace is about 5.2 m adequate to accommodate a platinum crucible 900 mm long and the associated crucible lowering equipment, that is, the aforementioned lowering device. The furnace has a temperature gradient of 10° C./cm and temperature fluctuations are controlled to within ±1° C. After the ferrite material was completely melted, the crucible was lowered at a speed of 3 mm/hour, by means of a lowering device. Lowering speed of a range of 0.5 to 5.0 mm/h may be applicable. When the lowermost portion of the crucible is lowered below the position of solidification temperature which is 1,580°–1,590° C., a single crystal was grown from the lowermost portion of the crucible. Thus a preparation was now completed.

From the time when a crystal was grown to have a length (or thickness) of about 50 mm from the lower extremity of the crucible and when the liquidus zone had a depth of about 40 mm, an addition or replenishment of the ferrite material was commenced. The supplied ferrite material was of rod shape having a diameter of 30 mm, and composed of 53.0 mol percent of $Fe_2O_3$, 29.0 mol percent of MnO and 18.0 mol percent of ZnO.

The rod shaped ferrite material was dipped into the liquidus zone, and lowered in accordance with the growing speed of crystal to be dissolved successively. The rod shaped solid was lowered at a speed of 27.0 mm/h, but the range of 4.5 to 45.0 mm/h would be applicable. Thus, a depth of the liquidus zone was maintained constant. The crystallization was carried out for 14 days and thereafter the dipping of the ferrite rod was stopped to permit a natural growth for two days.

Diameter of the ferrite rod is selected to be about one-third of the diameter of the crucible. Thus, the ferrite rod was used in the above-described experiment, having a diameter of 30 mm in light of the crucible diameter of 900 mm. The inventors have found that a greater diameter causes a decrease of temperature of the liquidus zone and disadvantageous influence on crystallization temperature. On the other hand, small diameter of the ferrite rod requires a rapid addition of the ferrite rod into the crucible since a lowering speed of the ferrite rod is higher in order to maintain the depth of the liquidus zone constant.

Figure 4:
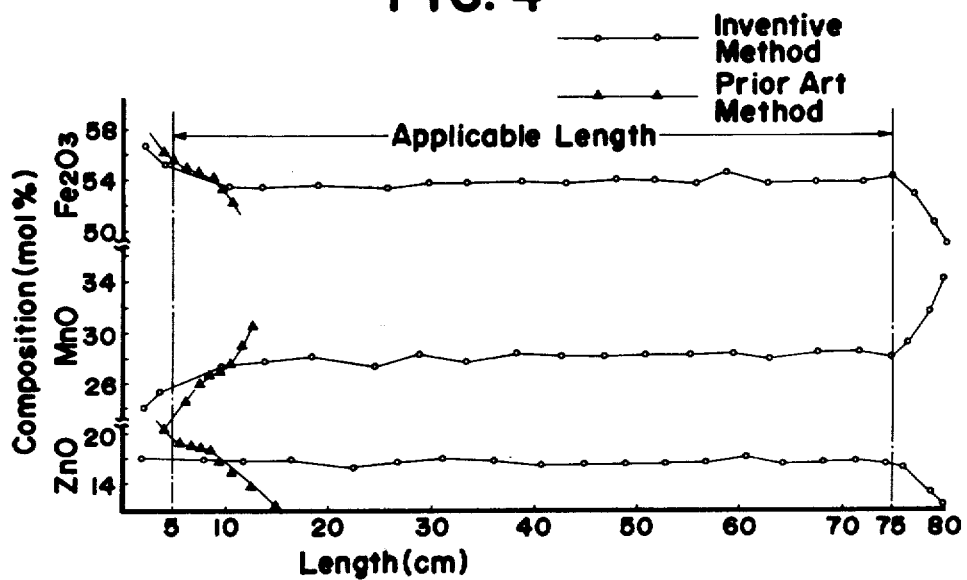
FIG. 4 is a diagram which shows compositional variation in lengthwise direction of crystals according to the present invention and to the conventional method.

The composition of the ferrite rod as measured along the direction of growth is shown in FIG. 4. As is apparent from the drawing, the fluctuation is slight except for the extreme 50 mm sections. Each component, $Fe_2O_3$, MnO and ZnO are controled to within ±0.5 mol percent while the variation is 3 to 5 mol percent for crystals grown by the ordinary Bridgman process.

As the ferrite composition contains more than 50 mol percent of $Fe_2O_3$, the partial pressure of oxygen is preferably maintained low enough during cooling below 1,200° C. to avoid the segregation of $Fe_2O_3$. Due to vaporization losses during growth, $Fe_2O_3$ was 0.8 mol percent higher, MnO was 0.4 mol percent higher, and ZnO was 1.2 mol percent lower in the crystal than in the supplied rod material.

Though the present invention has been described with reference to a single crystal of a Mn-Zn type ferrite, it will be readily understood from the foregoing that another type of ferrites, such as Ni-Zn type ferrite, may be used in a similar manner for producing a single crystal of another type of conposition. Further, at least a part of each component of MnO, NiO and ZnO can be replaced by CaO, $SnO_2$, CoO, MgO, $V_2O_5$, $TiO_2$, $Cr_2O_3$ or rare earth metal oxides.

As is understood from the foregoing, the process of the present invention permits the growth of huge, homogeneous single crystals which comprise desired electromagnetic properties such as initial permeability, magnetic flux density, loss factor, etc, which are required in magnetic head cores. Further, the process of the present invention meets with requirement of mass fabrication.

Although the present invention has been described with reference to a preferred embodiment thereof, modifications and alterations may be made within the spirit of the invention.

What is claimed is:

1. A process for producing ferrite single crystals comprising the steps of placing ferrite materials in a lower portion of a crucible, melting the ferrite material completely in a heating zone of a furnace maintained above the solidification temperature of the ferrite to produce a liquid-phase zone of 4 to 15 cm in length, moving said lower portion of the crucible out of the heating zone of the furnace to cause the melted ferrite materials to crystallize progressively from a bottom of said crucible, simultaneously and continuously supplying a rod shaped ferrite solid having a diameter substantially equal to one third the diameter of the crucible into said crucible while the melted ferrite materials are crystallizing with the depth of the liquid-phase zone of melted ferrite being maintained constant, said ferrite solid being substantially in equilibrium in composition to the liquid-phase zone.

2. The process of claim 1, wherein said rod shaped solid has a diameter of about 30 mm and said crucible has a diameter of about 90 mm.

3. The process of claim 2, wherein said crucible is lowered at a speed of 3 mm/h and said rod shaped solid is lowered at a speed of 27.0 mm/h.

4. The process of claim 1, wherein said solid is selected from the forms of pellet, disc and powder.

5. The process of claim 1, wherein the ferrite materials are selected from Mn-Zn type ferrite and Ni-Zn type ferrite.

6. The process of claim 5, wherein each component of MnO, NiO and ZnO is at least partly replaced by any one of CaO, $SnO_2$, CoO, MgO, $V_2O_5$, $Cr_2O_3$, $TiO_2$ and rare earth metal oxides.

7. The process of claims 1, wherein the heating zone has a temperature gradient from top to bottom of 5° to 80° C./cm.

8. Process for producing ferrite single crystals comprising:
   a. supplying a ferrite material into a lower portion of a crucible to be dissolved thereby forming a liquid-phase zone,
      said ferrite material consisting of 52.0 mol percent of $Fe_2O_3$, 29.0 mol percent of MnO and 19.0 mol percent of ZnO,
   b. lowering said crucible gradually at a speed of 3 mm/h, below a portion of solidification temperature,
   c. dipping a ferrite rod into said liquid-phase zone immediately after the liquid-phase zone becomes about 40 mm in thickness and a crystalization grows to the length of about 50 mm,
      said ferrite rod consisting of 53.0 mol percent of $Fe_2O_3$, 29.0 mol percent of MnO and 18.0 mol percent of ZnO,
   d. lowering continuously and gradually said ferrite rod at a speed corresponding to a speed of the crystallization thereby maintaining the depth of said liquid-phase zone constant.

* * * * *